United States Patent [19]
Benchikha et al.

[11] Patent Number: 6,121,158
[45] Date of Patent: *Sep. 19, 2000

[54] METHOD FOR HARDENING A PHOTORESIST MATERIAL FORMED ON A SUBSTRATE

[75] Inventors: Hacene Benchikha; Koji Takagi, both of San Antonio; John Rivard, Mico, all of Tex.

[73] Assignees: Sony Corporation, Tokyo, Japan; Sony Electronics Inc., Park Ridge, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/910,308

[22] Filed: Aug. 13, 1997

[51] Int. Cl.$^7$ ................................................ H01L 21/31
[52] U.S. Cl. ................................... 438/766; 438/778
[58] Field of Search ..................... 430/311, 326; 427/316; 438/525, 558, 561, 565, 669, 694, 949, 766, 778

[56] References Cited

U.S. PATENT DOCUMENTS

| | | | |
|---|---|---|---|
| 4,027,324 | 5/1977 | Yagi et al. | 327/34 |
| 4,242,692 | 12/1980 | Hagiwara | 357/79 |
| 4,253,888 | 3/1981 | Kikuchi | 148/187 |
| 4,495,040 | 1/1985 | Panico | 204/155 |
| 4,584,055 | 4/1986 | Kayanuma et al. | 156/628 |
| 4,621,412 | 11/1986 | Kobayashi et al. | 29/571 |
| 4,771,009 | 9/1988 | Ueki | 437/12 |
| 5,240,819 | 8/1993 | Mueller et al. | 430/326 |
| 5,317,432 | 5/1994 | Ino | 359/59 |
| 5,355,006 | 10/1994 | Iguchi | 257/296 |
| 5,357,122 | 10/1994 | Okubora et al. | 257/84 |
| 5,399,526 | 3/1995 | Sumi | 437/190 |
| 5,401,679 | 3/1995 | Fukusho | 437/50 |
| 5,532,114 | 7/1996 | Bae | 430/312 |
| 5,541,124 | 6/1996 | Miwa et al. | 437/31 |
| 5,563,082 | 10/1996 | Mukai | 437/41 |
| 5,585,302 | 12/1996 | Li | 437/60 |

Primary Examiner—Charles Bowers
Assistant Examiner—Reneé R. Berry
Attorney, Agent, or Firm—Christopher M. Tobin

[57] ABSTRACT

A method for hardening a photoresist material formed on a semiconductor substrate comprising the steps of coating a surface of a substrate of a wafer with a layer of photoresist material. Next, the layer of photoresist material disposed on the surface of the substrate of the wafer is masked, exposed, and developed to provide a patterned photoresist material. The patterned developed photoresist material layer is then inspected for critical dimensions, linewidths, and other dimensional characteristics. After the inspection, UV radiation is used to cure the patterned developed photoresist material layer to provide a hardened patterned developed photoresist material layer which is disposed on the surface of the substrate of the wafer. Next, the hardened patterned developed photoresist material layer is implanted from a first implant direction with an inert species material such as argon. Following the implantation step, the first implant direction is incremented 90 degrees to a second implant direction. The hardened patterned developed photoresist material layer is then implanted from the second implant direction with an identical dose of argon. Then, the second implant direction is incremented by another 90 degrees. Two addition implants are performed each from a different implant direction such that the hardened patterned developed photoresist material layer is implanted with equivalent doses of argon from four implant directions each angularly spaced apart by 90 degrees. After implantation, unmasked portions of the substrate of the wafer are etched. Next, the hardened patterned developed photoresist material layer is stripped from the surface of the substrate.

28 Claims, 5 Drawing Sheets

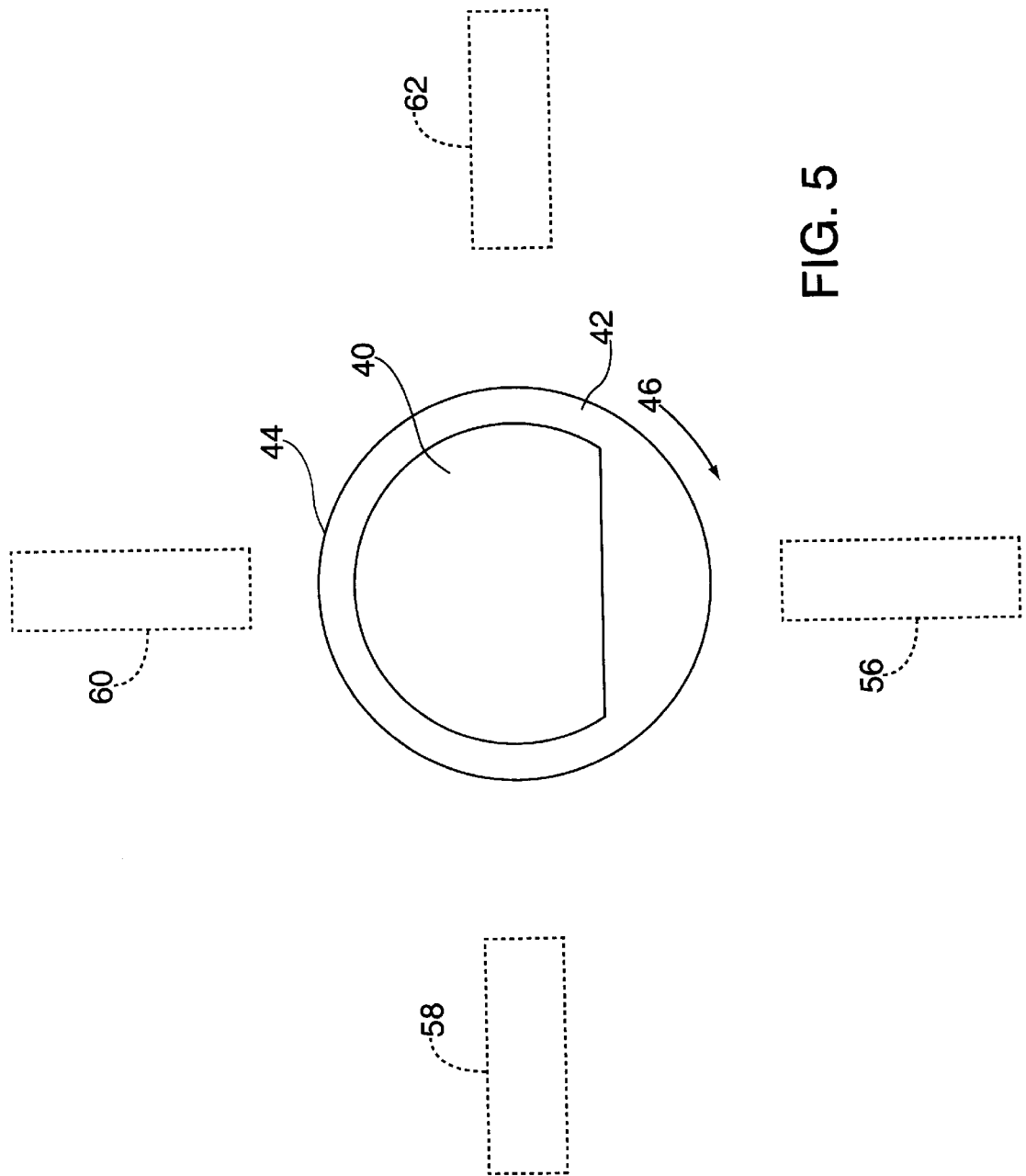

METHOD FOR HARDENING A PHOTORESIST MATERIAL FORMED ON A SUBSTRATE

BACKGROUND

1. Field of Invention

This invention relates generally to the field of semiconductor manufacturing. More particularly, this invention relates to a method for hardening a developed patterned photoresist material layer disposed on a surface of a substrate of a semiconductor wafer.

2. Background of the Invention

The fabrication of integrated circuits requires the introduction of precisely controlled quantities of materials into microscopic regions of a substrate of a semiconductor wafer. The patterns that define such microscopic regions are created by a lithographic process. The basic sequences of steps that comprise the lithographic process include cleaning the substrate, coating the substrate with a photoresist material layer, baking the photoresist material layer, exposing the baked or cured photoresist material layer, developing the exposed photoresist material layer to form masked and unmasked regions of the substrate, baking the developed photoresist material layer, etching the unmasked regions of the substrate, and stripping the developed photoresist material layer away from the masked (i.e. non-etched) regions of the substrate.

Initially, the substrate is cleaned to remove dirt or other contaminating particles so that the subsequent steps in the lithographic process are not adversely affected. Following cleaning, a surface of the substrate of the wafer is coated with a uniform, adherent, defect-free polymeric layer of predetermined thickness of photoresist material. After the substrate is coated with the photoresist material layer, it is usually subjected to a soft-bake or pre-bake step. In this step the substrate is subjected to an elevated temperature to drive out solvents from the photoresist material layer, to improve the adhesion of the photoresist material to the surface of the substrate, and to anneal the stresses caused by the shear forces encountered in the spinning process.

After the substrate has been coated with the photoresist material and suitably soft-baked, it is exposed to some form of radiation in order to create a latent image in the photoresist material. Following exposure, the photoresist material layer is developed in order to leave behind the image which will serve as the mask for etching, ion-implantation, or other subsequent processing steps. Following development an inspection is performed to ensure that the steps of the lithographic process up to this point have been performed correctly and to within the specified tolerance. Mistakes or unacceptable process variations can still be corrected, since the lithographic process has not yet produced any changes; that is, for example, the substrate of the wafer has not been etched or otherwise removed. Thus, an inadequately processed wafer can be reworked by merely stripping away the developed photoresist material layer and starting the lithographic process over again.

Post-baking is a process step which subjects the developed photoresist material layer on the substrate to an elevated temperature. The post-baking step is usually performed after development but, generally, just prior to the etching step. Post-baking is performed in order to remove residual solvents in the developed photoresist material layer so as to improve its adhesion to the substrate, and to increase the etch resistance of the photoresist material. Etch resistance is the ability of a photoresist material to endure the etching procedure during the pattern transfer process.

It is necessary to tightly control the fine feature sizes of the pattern of the developed photoresist material layer disposed on the substrate of the wafer while the wafer is being subjected to a variety of manufacturing processes that involve elevated temperatures. During processes such as ion implantation or plasma etching, for example, the temperature can rise high enough to cause the developed photoresist material layer to flow. Also, some post-bake procedures are designed to expose the developed photoresist material layer to a temperature that is sufficiently high enough to cause it to flow thereby reducing the incidence of pinholes or thin spots therein prior to etching. However, such flow of the developed photoresist material layer may also reduce the resolution of the features in the original pattern. In response, it is known that, prior to etching, simultaneously heating the developed photoresist material layer with a heat source and irradiating it with a UV light source will harden the developed photoresist material layer and make it more resistant to flow. It is also known to use UV photostabilization to condition the developed photoresist material layer prior to subjecting it to the harsh dry etching conditions that are used in subsequent processing steps.

The etch resistance of a photoresist material layer may also be affected by ion implantation with a high-dose, low-energy beam. During ion implantation, energetic, charged atoms or molecules of an implant species (e.g. argon, arsenic, boron, etc.) are directly introduced into a substrate. It is known to use a bi-directional ion implantation to further harden a developed photoresist material layer. During the bidirectional ion implantation, atoms of an inert material, such as argon, are directed to and implanted into the developed photoresist material layer disposed on the substrate of the wafer. In a well known manner, the wafer is repositioned by rotating it 180 degrees. Then, the argon atoms are again directed to and implanted into the developed photoresist material layer. After the developed photoresist material layer is hardened through UV curing and implantation, unmasked regions of the substrate are etched. Then, the developed photoresist material layer is stripped off from masked or non-etched regions of the substrate of the wafer.

A shortcoming of the foregoing approach is that during the etch step, the developed photoresist material layer is prone to flaking. Flaking is the erosion or collapse of a sidewall of the developed photoresist layer during etch caused by non-uniform hardening of the photoresist during implanting. Flaking occurs when holes develop in the sidewall of the developed photoresist material layer. Such holes are visible using a scanning electron microscope (SEM) under 40,000 times magnification. Flaking results in contaminating particles which cause connectivity and other problems in the subsequently fabricated semiconductor device. Also, flaking of the developed photoresist material layer erodes the mask that covers portions of the substrate that are not to be etched. Flaking causes the loss of control of the critical dimensions necessary to fabricate modern integrated circuits. There is, therefore, a need to provide a process for hardening and increasing the etch resistance of a developed and patterned photoresist material layer disposed on a substrate of a wafer such that when the developed photoresist material layer is etched it does not flake.

SUMMARY OF THE INVENTION

It is an object of the present invention to provide increased yield in a semiconductor manufacturing environment.

It is another object of the present invention to reduce contamination during the manufacture of a semiconductor device.

It is yet another object of the present invention to more accurately control critical dimensions during the manufacture of a semiconductor device.

It is still another object of the present invention to provide a method of forming a developed photoresist material layer such that flaking is not present when the developed photoresist material layer is etched.

Briefly, a preferred embodiment of the present invention includes the steps of first coating a surface of a substrate of a wafer with a layer of photoresist material. Next, the photoresist material layer is masked, exposed, and developed to provide a patterned developed photoresist material layer. The patterned developed photoresist material layer is inspected for critical dimensions, linewidths, and other dimensional characteristics. After the inspection, the patterned developed photoresist material layer is illuminated with UV radiation to form a hardened patterned developed photoresist material layer. Next, the hardened patterned developed photoresist material layer is implanted from a first implant direction with an inert species material such as argon. Following the implantation step, the first implant direction is incremented by 90 degrees to a second implant direction. The hardened patterned developed photoresist material layer is then implanted from the second implant direction with an identical dose of argon. Then, the second implant direction is incremented by another 90 degrees. Two additional implants are performed each from a different implant direction such that the hardened patterned developed photoresist material layer is implanted with equivalent doses of argon from four implant directions each of which are angularly spaced apart by 90 degrees. After implantation, unmasked portions of the substrate of the wafer are etched. Next, the hardened patterned developed photoresist material layer is stripped from the surface of the substrate.

It is an advantage of the present invention that yields are increased and contamination is reduced during the fabrication of a semiconductor wafer.

It is another advantage of the present invention that critical dimensions are more accurately controllable during the manufacture of a semiconductor wafer.

It is yet another advantage of the present invention that a hardened patterned developed photoresist material layer may be formed which does not flake during the etch process.

These and other objects, advantages, and features of the invention will become apparent to those skilled in the art upon consideration of the following description of the invention.

BRIEF DESCRIPTION OF THE DRAWING

FIG. 5 is a plan view schematically depicting alternate ways of incrementing the implant direction.

DETAILED DESCRIPTION OF THE INVENTION

Figure 1:
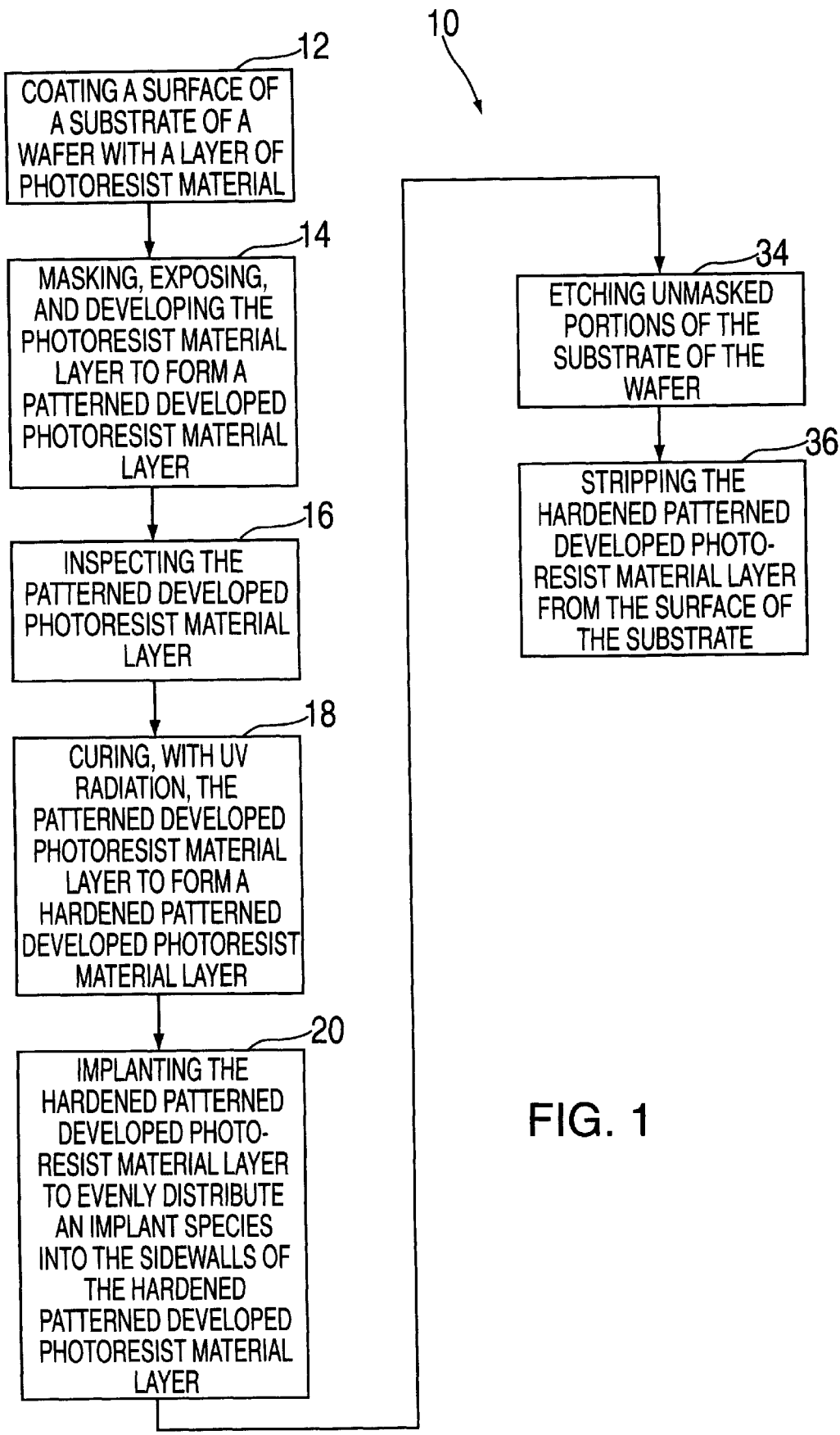
FIG. 1 is a diagram of the process steps of an embodiment of the present invention.

While this invention is susceptible of embodiments in many different forms, there will be shown in the drawing and will herein be described in detail specific embodiments, with the understanding that the present disclosure is to be considered as an example of the principles of the invention and not intended to limit the invention to the specific embodiment shown and described.

Referring to FIG. 1, the process of the present invention is illustrated in the form of a flow diagram. A lithographic process 10 of the present invention includes a step 12 wherein a surface of a substrate of a wafer is coated with a layer of photoresist material. The substrate can be a semiconductor material layer, a metal layer, an insulator or a dielectric material layer. The surface, the substrate, the wafer, and the photoresist material layer are not shown in the figure. Next, at step 14, the photoresist material layer disposed on the surface of the substrate of the wafer is masked, exposed, and developed to provide a patterned developed photoresist material layer. A step 16 is performed to inspect the patterned developed photoresist material layer for critical dimensions, linewidths, and other dimensional characteristics. The process 10 continues with a step 18 wherein UV radiation illuminates the patterned developed photoresist material layer to provide a hardened patterned developed photoresist material layer. Next, a step 20 is performed wherein the hardened patterned developed photoresist material layer is implanted with a dosage of an inert species material such as argon. The implantation step 20 is performed in such a manner so as to evenly distribute the implant species into the sidewalls of the hardened patterned developed photoresist material layer. At step 34, the unmasked portions of the substrate of the wafer are etched. Next, at step 36, the hardened patterned developed photoresist material layer is stripped away from the surface of the substrate. The steps 12, 14, 16, 18, 34, and 36 of the procedure 10 are known, and, therefore, will not be further described herein so as to not obscure the description of the present invention unnecessarily.

Figure 2:
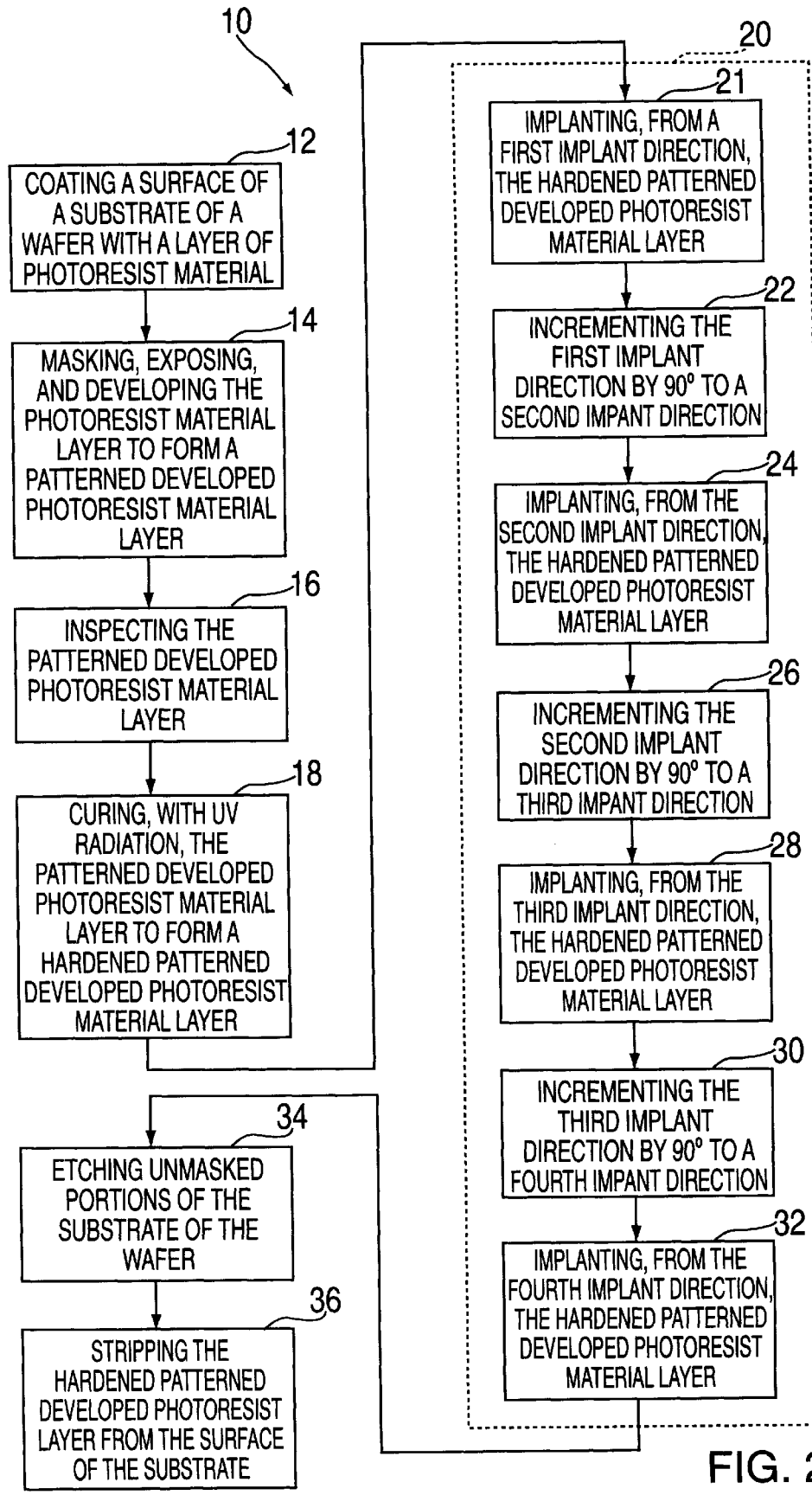
FIG. 2 is a diagram of the process steps of another embodiment of the present invention.

Referring now to FIG. 2 which is a flow diagram illustrating a preferred embodiment of the present invention in which like reference numerals indicate similar steps and/or elements. The step 20 (FIG. 1) further includes a step 21 wherein the hardened patterned developed photoresist material layer is implanted with a dose of inert implant species such as argon, from a first implant direction. At step 22, the first implant direction is incremented by 90 degrees to a second implant direction and, at step 24, the hardened patterned developed photoresist material layer is implanted with an equivalent dose of argon, from the second implant direction. At step 26, the second implant direction is incremented by another 90 degrees to a third implant direction. Then, at step 28, the hardened patterned developed photoresist material layer is implanted with a third equivalent dose of argon, from the third implant direction. At step 30, the third implant direction is incremented by yet another 90 degrees to a fourth implant direction. Next, at step 32, the hardened patterned developed photoresist material layer is implanted with yet another equivalent dose of argon, from the fourth implant direction. Thus, the hardened patterned developed photoresist material layer is implanted with four equivalent doses of an inert implant species such as argon, from four different implant directions each of which are angularly spaced apart by 90 degrees.

Figure 3:
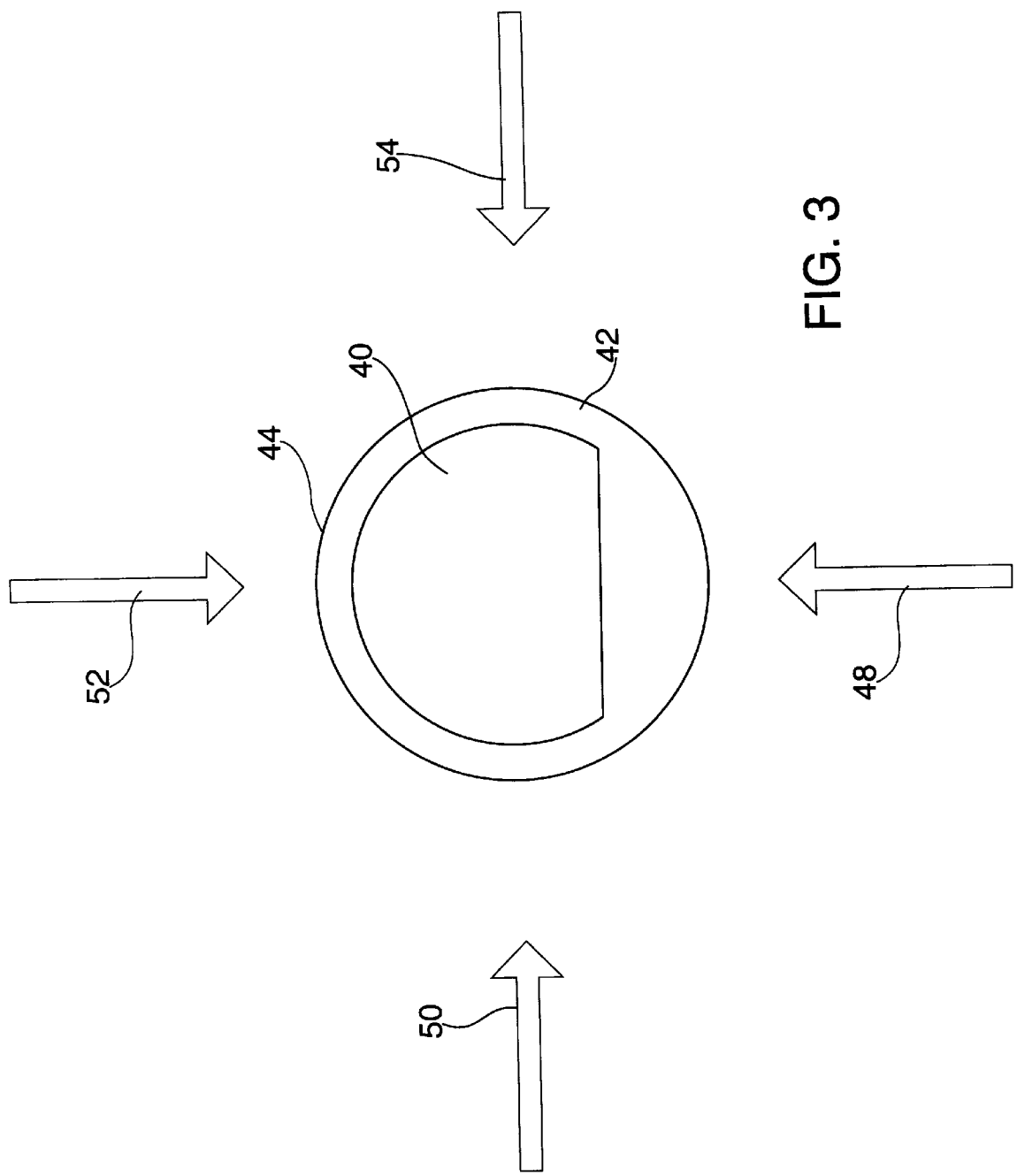
FIG. 3 illustrates a plan view of a schematic representation of a semiconductor wafer attached to a supporting platform which is disposed proximate to an ion implantation device.

Referring now to FIG. 3, which is a schematic representation showing a plan view of a processing setup. More specifically, FIG. 3 illustrates a semiconductor wafer 40 which is attached to a surface 42 of a support platform 44. A substrate is disposed on the wafer 40 and can be made up of semiconductor, metal, insulator or dielectric materials.

The platform 44 and the wafer 40 are disposed proximate to an ion beam output of an ion implantation apparatus (not shown). An implant direction is defined as the direction of an ion beam output from an ion implantation device relative to the wafer 40 and exemplary implant directions are indicated by each of the arrows 48, 50, 52, and 54. FIG. 3 illustrates, for example, that the wafer 40 is implanted from each of four different implant directions each of which are angularly spaced apart by 90 degrees. An implant incidence angle is the angle of incidence of an ion implantation beam with respect to the plane of the wafer 40. An implant incidence angle of 11 degrees, for example, means that an ion implantation beam is angled 11 degrees from a vertical line which is perpendicular to the wafer 40 and the support platform 44.

Figure 4:
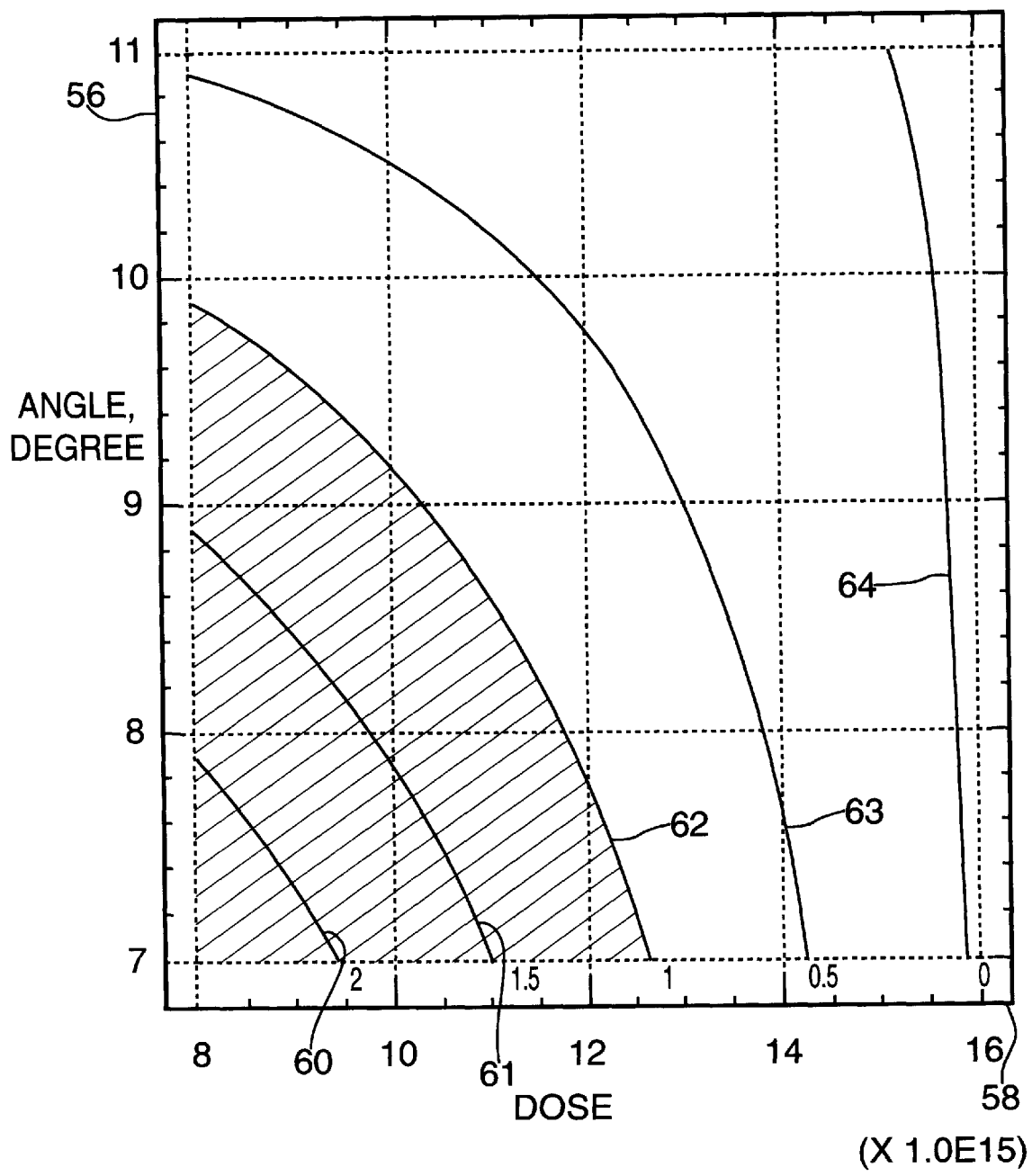
FIG. 4 is a contour plot illustrating predicted levels of flaking for varying implant doses and angles.

FIG. 4 is a contour plot showing the amount of flaking of the hardened patterned developed photoresist material layer for varying implant doses and implant incidence angles. In all the cases illustrated in FIG. 4, the implant species used was argon and there were four implant directions each of which is angularly spaced apart by 90 degrees. Further, in all cases illustrated in FIG. 4, an Eaton NV-GSD implanter was used and operated at an energy level of 70 KeV. The value of implant incidence angle is plotted along the vertical axis 56. Total implant dosage is plotted along the horizontal axis 58. Total implant dosage is the sum of an implant dose from each of the implant directions. In cases illustrated in FIG. 4, for example, the implant dose from each implant direction is the total implant dosage divided by four, since there are four implant directions. Also shown are a plurality of contours 60, 61, 62, 63, and 64. Each of the contours 60, 61, 62, 63, and 64 are respectively associated with a flaking rating of 2, 1.5, 1, 0.5, and 0. The degree of photoresist flaking is rated on a scale from 0 to 3, where a 0 to 0.5 rating corresponds to no flaking, a rating of 1 rating represents very slight holes in the photoresist, a 1.5 to 2 rating corresponds to visible flaking at one site, and a 3 rating corresponds to visible flaking at all sites.

The inventors of the present invention have determined that merely using an implant from four implant directions each of which are angularly separated apart by 90 degrees, a so-called "quad implant," would not eliminate flaking of the photoresist material unless such a quad implant is used with the proper combination of implant dosage level and implant incidence angle. The inventors of the present invention have also found that neither implant current or etch time influences the level of photoresist flaking. As shown in FIG. 4, flaking occurs with dosages and incidence angle values characteristic of the shaded region illustrated to the left of the contour line 62. The lowest operating conditions which will not cause flaking are found at either end of the line 62: 7 degrees implant incidence angle at a total dosage of 1.25 E16; and 10 degrees implant incidence angle at a total dosage of 8.0 E15. In the preferred embodiment of the present invention, each of the implant steps 21, 24, 28, and 32 is performed under the following conditions: the implant energy is 70 KeV; the implant species is argon; the implant dosage per implant direction is 2.0 E15 (total dosage is 8.0 E15); the implant incidence angle is 11 degrees. The inventors of the present invention have found that total implant dosages exceeding 1.6 E16 could be used during the implant steps of the present invention. However, such higher dosages increase the difficulty of stripping or removing the photoresist material layer thereby adversely effecting production throughput.

Regarding the implant direction incrementing steps 22, 26, 30 (FIG. 2), the implant direction may be incremented as illustrated in FIG. 5. As shown in the figure, the wafer 40 and the platform 44 can be rotated in a direction of an arrow 46 by means of a rotating mechanism (not shown) which is in mechanical communication with the platform 44. The manner of rotating the wafer 40 so as to accomplish the incrementing step set forth in each of the steps 22, 26, and 30, can be accomplished using any one of a number of devices known in the art. A description of such rotation devices will not be described further so as to not obscure the description of the present invention. Alternatively, the ion beam output device 56 of an implantation device may be disposed at a plurality of locations along the circumference of the platform 44, as indicated by the dashed boxes 58, 60, and 62. In this alternative embodiment, the photoresist material disposed on the substrate of the wafer will be sequentially exposed to four doses of implant species coming from four directions each of which is angularly spaced apart by 90 degrees.

The inventors of the present invention discovered that flaking of the photoresist material layer occurred when a bi-directional type implant was used. As described above, during such a bi-directional implant process, a hardened patterned developed photoresist material layer is implanted from two opposing implant directions, i.e., from two implant directions angularly spaced apart by 180 degrees. However, it was found that during subsequent etch procedures the hardened patterned developed photoresist material layer flaked. Various methods were tried in unsuccessful attempts to eliminate flaking. The implant energy, for example, was increased to a maximum value of 80 KeV but the flaking was not eliminated. Also, increasing the total implant dosage from 5 E15 (2.5 E15 from one of the two implant directions) to 8 E15 did not eliminate the flaking. Likewise, varying the implant incidence angle from 7 to 11 degrees did not eliminate the flaking. Several experimental runs were conducted using various combinations and permutations of the foregoing parameters without eliminating the flaking.

In the prior art bi-directional implant procedure, a first implant direction was incremented by 180 degrees to a second implant direction. The implanter devices used to perform the known bi-directional implant procedure were not fully automated. Altering an implant direction required an operator to manually reposition the wafer in order to change the implant direction. An operator would have to manually reposition the wafer once, thereby incrementing the implant direction once, in order to effect a bi-directional implant procedure. Such a single repositioning step reduced the throughput of the implanter device. However, repositioning the wafer three times in order to increment the implant direction three times thereby creating four different implant directions, would have required too much operator intervention resulting in a significant and unacceptable reduction in the throughput of the implanter device. Thus, no thought was given to increasing, beyond two, the number of different implant directions from which the photoresist material layer could be implanted.

The inventors of the present invention discovered that flaking was eliminated if implant ions are evenly distributed on the sidewall of a hardened patterned developed photoresist material layer. After a positive type photoresist material layer is developed, the exposed portions of the photoresist material layer (or, in the case of a negative photoresist material layer, the non-exposed portions of the photoresist material layer) are washed away forming sidewall areas on the remaining portions of the photoresist material layer. It is believed that during a bi-directional implant procedure, some portions of the sidewall areas on the remaining photoresist material layer are not sufficiently implanted with the implant species. It is further believed, however, that an implant from at least four different implant directions each of which are angularly spaced apart by 90 degrees will evenly distribute the implant species in all portions of the sidewall areas on the remaining photoresist material layer.

In alternate embodiments of the present invention, a hardened patterned developed photoresist material layer may be implanted from more than four implant directions each of which are angularly spaced apart by an equal predetermined amount. The hardened patterned developed photoresist material layer may be implanted, for example, from five or six different implant directions each of which is angularly spaced 72 degrees or 60 degrees apart, respectively.

In other alternate embodiments of the present invention, a hardened patterned developed photoresist material layer may be implanted from at least four implant directions wherein the angular spacing between adjacent implant directions is not equal for all implant directions, i.e., each of the four implant directions are angularly spaced apart by unequal amounts. The hardened patterned developed photoresist material layer may be implanted, for example, from five different implant directions. The angular spacing between each pair of adjacent implant directions may be, for example, 70, 74, 71, 73, and 72 degrees.

In still other alternate embodiments of the present invention, each of the implants from each of the implant directions may be performed simultaneously instead of sequentially as in a preferred embodiment of the present invention.

Thus, it is apparent that in accordance with the present invention, a preferred method and alternate methods that fully satisfy the objectives and advantages are set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A method for making a hardened photoresist material layer on a surface of a substrate of a semiconductor wafer, comprising the steps of:

coating said surface of said substrate of said semiconductor wafer with a layer of photoresist material;

masking, exposing, and developing said photoresist material layer to form a patterned developed photoresist material layer;

curing said patterned developed photoresist material layer to form a hardened patterned developed photoresist material layer;

implanting said hardened patterned developed photoresist material layer from a plurality of different implant directions with a dose of implant species to evenly distribute said implant species into said hardened patterned developed photoresist material layer; and etching unmasked portions of said substrate of said semiconductor wafer.

2. The method for making a hardened photoresist material layer according to claim 1, wherein each of said implant directions are spaced apart by an equal amount.

3. The method for making a hardened photoresist material layer according to claim 1, wherein each of said implant directions are spaced apart by unequal amounts.

4. The method for making a hardened photoresist material layer according to claim 2, wherein said curing step includes irradiating said patterned developed photoresist material layer with a UV source.

5. The method for making a hardened photoresist material layer according to claim 4, wherein said dose of said implant species is 2.0 E15.

6. The method for making a hardened photoresist material layer according to claim 5, wherein said implant species is argon.

7. The method for making a hardened photoresist material layer according to claim 3, wherein said curing step includes irradiating said patterned developed photoresist material layer with a UV source.

8. The method for making a hardened photoresist material layer according to claim 7, wherein said dose of said implant species is 2.0 E15.

9. The method for making a hardened photoresist material layer according to claim 8, wherein said implant species is argon.

10. A method for making a hardened photoresist material layer on a surface of a substrate of a semiconductor wafer, comprising the steps of:

coating said surface of said substrate of said semiconductor wafer with a layer of photoresist material;

masking, exposing, developing said photoresist material layer to form a patterned developed photoresist material layer;

curing said patterned developed photoresist material layer to form a hardened patterned developed photoresist material layer;

implanting, from a first implant direction, said hardened patterned developed photoresist material layer with a predetermined dose of particles of an implant species;

incrementing said first implant direction by a first predetermined amount to a second implant direction;

implanting, from said second implant direction, said hardened patterned developed photoresist material layer with said predetermined dose of particles of said implant species;

incrementing said second implant direction by a second predetermined amount to a third implant direction;

implanting, from said third implant direction, said hardened patterned developed photoresist material layer with said predetermined dose of particles of said implant species;

incrementing said third implant direction by a third predetermined amount to a fourth implant direction;

implanting, from said fourth implant direction, said hardened patterned developed photoresist material layer with said predetermined dose of particles of said implant species; and etching unmasked portions of said substrate of said semiconductor wafer.

11. The method for making a hardened photoresist material layer according to claim 10, wherein said incrementing step is performed by rotating said wafer.

12. A method for making a hardened photoresist material layer on a surface of a substrate of a semiconductor wafer, comprising the steps of:

coating said surface of said substrate of said semiconductor wafer with a layer of photoresist material;

masking, exposing, developing said photoresist material layer to form a patterned developed photoresist material layer;

curing said patterned developed photoresist material layer to form a hardened patterned developed photoresist material layer;

implanting, from a first implant direction, said hardened patterned developed photoresist material layer with an implant dose of particles of an implant species;

incrementing said first implant direction by a first angle amount to a second implant direction;

implanting, from said second implant direction, said hardened patterned developed photoresist material layer with said implant dose of particles of said implant species;

incrementing said second implant direction by a second angle amount to a third implant direction;

implanting, from said third implant direction, said hardened patterned developed photoresist material layer with said implant dose of particles of said implant species;

incrementing said third implant direction by a third angle amount to a fourth implant direction;

implanting, from said fourth implant direction, said hardened patterned developed photoresist material layer with said implant dose of particles of said implant species; and etching unmasked portions of said substrate of said semiconductor wafer.

13. The method for making a hardened photoresist material layer according to claim 11, wherein said first predetermined amount is not equal to at least one of said second, third, and fourth predetermined amounts.

14. The method for making a hardened photoresist material layer according to claim 12, wherein said first, second, third, and fourth angle amounts are equal.

15. The method for making a hardened photoresist material layer according to claim 12, wherein said first angle amount is not equal to at least one of said second, third, and fourth angle amounts.

16. The method for making a hardened photoresist material layer according to claim 15, wherein said implant species is argon.

17. The method for making a hardened photoresist material layer according to claim 13, wherein said curing step includes irradiating said patterned developed photoresist material layer with a UV source.

18. The method for making a hardened photoresist material layer according to claim 17, wherein said dose of said implant species is 2.0 E15.

19. The method for making a hardened photoresist material layer according to claim 18, wherein said implant species is argon.

20. The method for making a hardened photoresist material layer according to claim 10, wherein said curing step includes irradiating said patterned developed photoresist material layer with a UV source.

21. The method for making a hardened photoresist material layer according to claim 20, wherein said dose of said implant species is 2.0 E15.

22. The method for making a hardened photoresist material layer according to claim 21, wherein said implant species is argon.

23. A method for making a hardened photoresist material layer on a surface of a substrate of a semiconductor wafer, comprising the steps of:

coating said surface of said substrate of said semiconductor wafer with a layer of photoresist material;

masking, exposing, developing said photoresist material layer to form a patterned developed photoresist material layer having a plurality of sidewall portions;

curing said patterned developed photoresist material layer to form a hardened patterned developed photoresist material layer;

implanting, from a first implant direction, a first sidewall portion of said hardened patterned developed photoresist material layer with an implant dose of particles of an implant species;

incrementing said first implant direction by a first angle amount to a second implant direction;

implanting, from said second implant direction, a second sidewall portion of said hardened patterned developed photoresist material layer with said implant dose of particles of said implant species;

incrementing said second implant direction by a second angle amount to a third implant direction;

implanting, from said third implant direction, a third sidewall portion of said hardened patterned developed photoresist material layer with said implant dose of particles of said implant species;

incrementing said third implant direction by a third angle amount to a fourth implant direction;

implanting, from said fourth implant direction, a fourth sidewall portion of said hardened patterned developed photoresist material layer with said implant dose of particles of said implant species; and etching unmasked portions of said substrate of said semiconductor wafer.

24. The method for making a hardened photoresist material layer according to claim 15, wherein said curing step includes irradiating said patterned developed photoresist material layer with a UV source.

25. The method for making a hardened photoresist material layer according to claim 24, wherein said dose of said implant species is 2.0 E15.

26. The method for making a hardened photoresist material layer according to claim 25, wherein said implant species is argon.

27. The method for making a hardened photoresist material layer according to claim 25, wherein said implant species is nitrogen.

28. A method for making a hardened photoresist material layer on a surface of a substrate of a semiconductor wafer, comprising the steps of:

coating said surface of said substrate of said semiconductor wafer with a layer of photoresist material;

masking, exposing, developing said photoresist material layer to form a patterned developed photoresist material layer having a plurality of sidewall portions;

curing said patterned developed photoresist material layer to form a hardened patterned developed photoresist material layer;

implanting, from a first implant direction, a first sidewall portion of said hardened patterned developed photoresist material layer with an implant dose of particles of an implant species;

incrementing said first implant direction by a first angle amount to a second implant direction;

implanting, from said second implant direction, a second sidewall portion of said hardened patterned developed photoresist material layer with said implant dose of particles of said implant species;

incrementing said second implant direction by a second angle amount to a third implant direction;

implanting, from said third implant direction, a third sidewall portion of said hardened patterned developed photoresist material layer with said implant dose of particles of said implant species;

incrementing said third implant direction by a third angle amount to a fourth implant direction;

implanting, from said fourth implant direction, a fourth sidewall portion of said hardened patterned developed photoresist material layer with said implant dose of particles of said implant species; and etching unmasked portions of said substrate of said semiconductor wafer.

* * * * *